(12) United States Patent
Fujii

(10) Patent No.: US 6,434,717 B1
(45) Date of Patent: Aug. 13, 2002

(54) ERROR DETECTING DEVICE AND METHOD

(75) Inventor: Masatsugu Fujii, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/417,516

(22) Filed: Oct. 13, 1999

(30) Foreign Application Priority Data

Mar. 15, 1999 (JP) .......................................... 11-068030

(51) Int. Cl.[7] ........................ H03M 13/00; H03M 13/03
(52) U.S. Cl. ...................... 714/758; 714/786; 714/794; 714/795; 375/262; 375/341
(58) Field of Search ................................ 714/752, 758, 714/786, 788, 787, 792, 793, 794, 795, 796, 800; 375/262, 341; 370/252, 447; 341/50

(56) References Cited

U.S. PATENT DOCUMENTS 4,777,636 A * 10/1988 Yamashita et al. .......... 714/795
5,960,010 A * 9/1999 Liu et al. .................... 714/786
6,058,501 A * 5/2000 Urazoe et al. ............... 714/795
6,272,660 B1 * 8/2001 Chen et al. .................. 714/794

FOREIGN PATENT DOCUMENTS

JP          4-95415          3/1992

* cited by examiner

*Primary Examiner*—Emmanuel L. Moise
(74) *Attorney, Agent, or Firm*—Katten Muchin Zavis Rosenman

(57) ABSTRACT

A table describing the time transition relationships between flip-flops within a CRC circuit on a transmitting side is transformed, so that a table inverting the time transition relationships is generated. An inverse CRC circuit is generated based on the generated table. A CRC parity bit obtained by performing viterbi decoding is set as an initial state in respective flop-flops within the inverse CRC circuit. The portion except for the CRC parity bit of the decoded data is sequentially input and an operation is performed. When the entire decoded data is input, an initial state detecting unit determines that an error exists in reception data if the initial values set in the respective flip-flops within the CRC circuit by the transmitting side are not set in the respective flip-flops within the inverse CRC circuit.

13 Claims, 10 Drawing Sheets

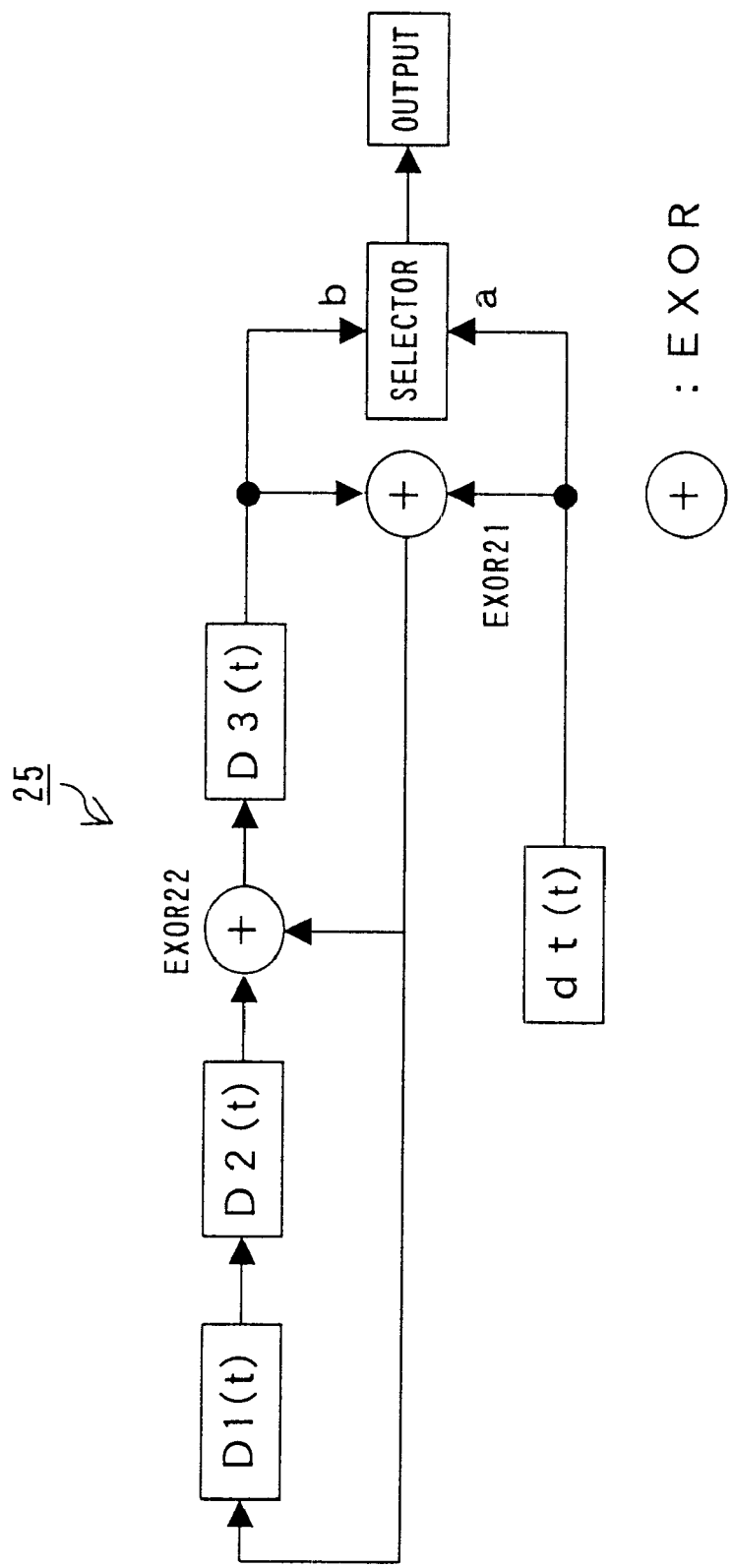
F I G. 8

ERROR DETECTING DEVICE AND METHOD

BACKGROUND OF THE INVENTION

1. Field of the Invention

The present invention relates to a device for detecting an error in a decoding result of an error correction code, for example, in a communications system or a broadcasting system, and a method thereof.

2. Description of the Related Art

In recent years, cellular phones have made remarkable progress and their market has rapidly been expanding. For such cellular phones, their communication devices must be reduced in size and consumption power, etc. A cellular phone of a smaller size, which is handy to carry, is considered to exploit a new market. Furthermore, if a cellular phone can support not only conventional voice communications but also data communications of, what is called, multimedia information such as documents, images, etc., its market value becomes very much large. Since such a cellular phone supporting data communications of multimedia information, etc. requires a large communication capacity as described above, it is vital to realize a large capacity communication with the smallest and simplest possible circuitry configuration. For this realization, it is inevitable to reduce an internal communication device in scale, weight, and size.

FIG. 1 is a block diagram showing the outline of the configuration of a conventional receiving device performing an error correction in reception data by using viterbi decoding which is one method of maximum likelihood decoding being one of error correction techniques in data communications, and CRC parity checking.

In this figure, remaining configuration except for the principal part relating to the present invention is omitted.

With viterbi decoding, data is decoded from its end. Therefore, also decoded data is output from its end to start. However, CRC checking cannot be made for viterbi-decoded data unchanged, which also affects data processing at subsequent stages. Therefore, after the bit order of viterbi-decoded data is inverted by storing the data output from a viterbi decoder 601 in a trace memory 603 and by reading the data from its start out of the trace memory 603, CRC parity checking and reception data process are performed. The decoded data read from the trace memory 603 is transmitted to a CRC parity checking unit 604, and also to a suitable processing circuit according to the type of the data. By way of example, after control data is converted from serial to parallel in a serial-to-parallel converter 605, the parallel data is written to a reception buffer 606. Upon completion of the write operation of the parallel data, a CPU 607 starts to read the data from the reception buffer 606, and performs the corresponding process.

The band of a signal received from an antenna not shown is converted from an RF band to a baseband via an IF band. Then, the signal is deinterleaved by a deinterleaver 600, and input to a viterbi decoder 601. The viterbi decoder 601 is composed of a viterbi decoding circuit 602 and the trace memory 603. As described above, the decoded data output from the viterbi decoding circuit 602 is output from its end to start in accordance with the decoding method. The trace memory 603 temporarily stores the data output from the viterbi decoding circuit 602, and outputs the decoded data from its start to end under the control of a controlling unit not shown.

The decoded data output from the viterbi decoder 601 is input to the CRC parity checking unit 604. The CRC parity checking unit 604 is a parity checking circuit which comprises a CRC circuit having the same configuration of that on a transmitting side. This unit generates a CRC bit for the decoded data with the CRC circuit, and determines whether or not the reception data includes an error by determining whether or not the generated CRC bit equals the CRC bit at the end of the decoded data. The determination result is notified from the CRC parity checking unit 604 to the CPU 607 or an adapter (ADP) 608 processing image data, etc.

The CPU 607 extracts the control data from the data stored in the reception buffer 606, and performs control according to the contents of the control data. The data decoded by the viterbi decoder 601 is input also to the adapter 608 or a voice codec 609. The adapter 608 or the voice codec 609 presents the input decoded data to a user as image or voice information via a facsimile 610, a PC 611, or a speaker 612.

FIG. 2 shows the format of normal transmission data before convolutional encoding for viterbi decoding is not performed.

A CRC bit 616 is appended to the end of data to be transmitted (original data) 615 on a transmitting side as shown in this figure, and CRC checking is made on a receiving side, so that an error in the reception data can be detected. If an error is detected in the reception data, a receiving terminal performs processes such as a process for requesting a transmitting station to retransmit the same data.

FIG. 3 is a block diagram showing the configuration of a CRC circuit 619 arranged on a transmitting side.

The CRC circuit 619 shown in this figure comprises flip-flops 620 (D1) through 622 (D3), a selector 625 for controlling output data, and exclusive-OR operation units EXORs 623 and 624.

Before the data 615 is input, all of the flip-flops 620 through 622 within the CRC (operation) circuit 619 are initialized (initiated to "0"). Then, the data 615 is input in bits, and a CRC operation is performed. The input data is captured into the CRC circuit 619 via the EXOR 624. The CRC operation is performed for the entire input data, so that a CRC parity bit is generated. However, since the selector 625 selects a terminal "a" while the CRC operation is performed, output data becomes the same as the input data. The states of the flip-flops 620 through 622 when the data 615 is input to the end become the CRC parity bit 616. FIG. 3 shows the circuit for generating the CRC parity bit 616 composed of 3 bits. When the entire input data is output, the selector 625 selects a terminal "b", and outputs the CRC parity bit 616 sequentially from D3 (flip-flop 622), D2 (flip-flop 621), to D1 (flip-flop 620). The output result 626 from the CRC circuit 616 is convolutional-encoded by a convolutional circuit which is not shown in this figure and arranged at the stage succeeding the CRC circuit, and is converted into a code which can be viterbi-decoded on a receiving side.

FIG. 4 shows the configuration of a CRC parity checking circuit 627 arranged in the device on a receiving side of the transmission data which is shown in FIG. 2 and is convolutional-encoded.

To make CRC parity checking on the receiving side, a CRC circuit 630 having the same configuration as that on a transmitting side is conventionally arranged. With this CRC circuit 630, the CRC parity bit of the data corresponding to the original data 615 of the decoded data 629 obtained with viterbi decoding is operated. The result of the CRC operation when the data corresponding to the original data 615 of the decoded data 629 is input to the CRC circuit 630 to its end is temporarily stored in a CRC operation result storing unit 632. Next, the CRC parity bit 616 appended on the transmitting side, that is, the CRC parity bit at the end of the decoded data 629 is extracted from the decoded data 629, an is stored in a storing unit 633. Then, the comparison between the bit value stored in the CRC operation result storing unit 632 and the bit value stored in the storing unit 633 is made. If they match, no error is determined to exist in the reception data. If they mismatch, an error is determined to exist in the reception data.

Conventionally, an error in reception data is detected by making CRC parity checking with the CRC circuit 630 having the same configuration as that of the CRC circuit 619 arranged in the device on a transmitting side as described above.

FIG. 5 explains the method for controlling a conventional reception buffer on a receiving side.

The bit string of the decoded data 629 decoded by the viterbi decoder 601 shown in FIG. 1 is serially input to the serial-to-parallel converter 605. After the bit string of the decoded data 629 is converted into parallel data in predetermined bits by the serial-to-parallel converter 605, it is input to the reception buffer 606. The parallel data is written to the reception buffer 606 sequentially from an address "0". Then, the controlling unit not shown determines whether or not the write operation of the decoded data 629 is completed up to the last address (an address "N" equivalent to the length of one packet of the data) (636). If the write operation is determined not to be completed, the write address in the reception buffer 606 is incremented by 1 (637). The next data is then stored in the address obtained by incrementing the above described address in the reception buffer 606. If the write operation is determined to be completed up to the address "N" in the reception buffer 606, permission to read from the reception buffer 606 is notified to a CPU (638).

As described above, the viterbi decoder 601 decodes and outputs original data from its end to start. This is because the viterbi decoder 601 decodes the data retroactively from the end while making a maximum likelihood determination. However, since the CRC parity checking circuit 627 shown in FIG. 4 obtains a CRC parity bit with the CRC circuit 630 having the same configuration as that on a transmitting side, the decoded data to be fed to the CRC circuit 630 must be input sequentially from its start to end. Therefore, a trace memory 603 must be arranged to reverse the bit order of the data decoded by the viterbi decoder 601 before the decoded data is input to the CRC parity checking unit 604. Furthermore, accesses must be made to the trace memory 603, which causes a processing delay.

SUMMARY OF THE INVENTION

An object of the present invention is to provide an error detecting device with a small processing delay, which is reduced in circuitry scale and consumes less power, and a method thereof.

A device according to the present invention is an error detecting device for detecting an error in a decoding result with an input of the decoding result of the code obtained by encoding a message composed of data and the parity bit of the data, which is appended to the end of the data. This device comprises: an operating unit, to which a bit string of a decoding result is input in a decoding order, for performing an operation process for generating a parity bit for all of bits except for the decoded value of the parity bit within the bit string by recognizing as an initial value the decoded value of the parity bit within the bit string, and for performing an inverse operation process; and a determining unit for determining whether or not the decoding result is an error by detecting whether or not the final operation result matches the initial state of the operation process for generating the parity bit.

A method according to the present invention is an error detecting method for detecting an error in a decoding result with an inout of the decoding result of the code obtained by encoding a message composed of data and the parity bit of the data, which is appended to the end of the data, comprising the steps of: (a) inputting a bit string of a decoding result in a decoding order; (b) performing an operation process for generating a parity bit for all of bits except for the decoded value of the parity bit within the bit string by recognizing as an initial value the decoded value of the parity bit within the bit string, and performing an inverse operation process: and (c) determining whether or not the decoding result is an error by detecting whether or not the final operation result obtained with the operation in step (b) matches the initial state of the operation process for generating the parity bit.

According to the present invention, an error in decoded data can be detected. by inputting the bit string of the decoded data sequentially in a decoding order, when original data is decoded from its end to start with a decoding process. Consequently, a conventionally required trace memory can be omitted, thereby reducing an error detecting device in size and power, and speeding up its processing.

BRIEF DESCRIPTION OF THE DRAWINGS

FIG. 8 shows the conventional CRC circuit shown in FIG. 3;

DESCRIPTION OF THE PREFERRED EMBODIMENTS

According to a preferred embodiment of the present invention, a conventionally required trace memory becomes unnecessary by using the relationship between the bit order of the data which is decoded and output from a viterbi decoder, the initial values of a CRC circuit, and a result of a CRC operation, and the time taken to access the trace memory is reduced, so that a processing delay required for detecting an error of reception data can be significantly reduced.

That is, in the preferred embodiment of the present invention, a circuit for which CRC parity checking can be made by using the relationship between the initial values of a CRC circuit, viterbi decoded data, and a result of a CRC operation even if the viterbi-decoded data is input in a decoding order (this circuit is hereinafter referred to as an inverse CRC circuit).

Use of this circuit for CRC parity checking allows a conventionally required trace memory to be omitted.

Figure 6:
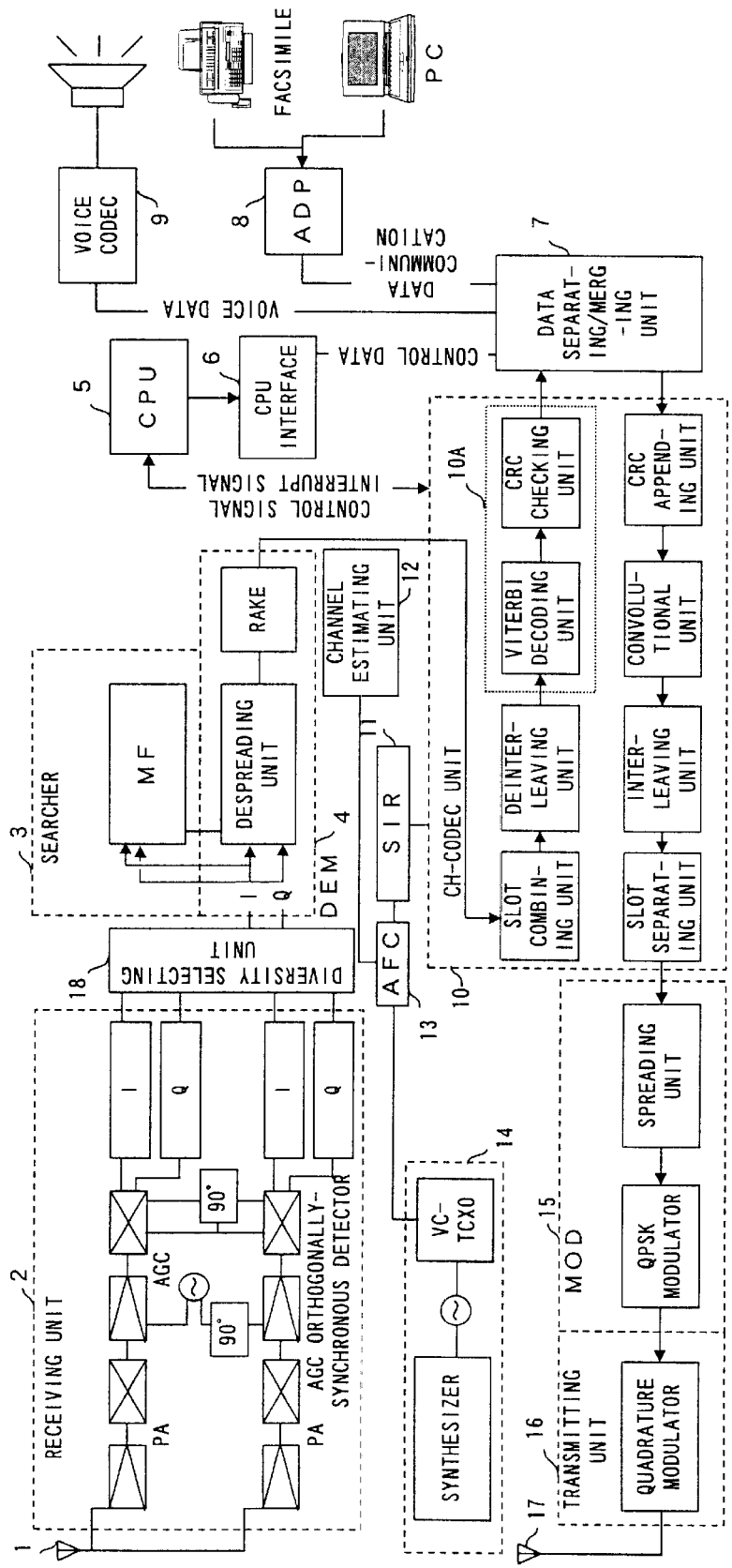
FIG. 6 exemplifies the entire configuration of a CDMA portable terminal being an example of a communication terminal to which an inverse CRC circuit according to a preferred embodiment of the present invention is applied.

FIG. 6 is a bock diagram showing the entire circuitry configuration of a CDMA portable terminal being an example of a communication terminal to which an inverse CRC circuit according to a preferred embodiment of the present invention is applied.

The preferred embodiment according to the present invention is implemented by applying an inverse CRC circuit to a portion 10A enclosed by a dotted line in a CH-CODEC unit 10 shown in FIG. 6. In the portion 10A, the number of memories must be decreased as few as possible in order to reduce the scale of the circuit and to speed up its processing, and processing data must be transmitted to the block at the next stage.

An antenna 1 receives a wireless signal transmitted from a base station. FIG. 6 shows only one antenna 1. Actually, however, a plurality of reception systems (for respective branches) are arranged for diversity reception. After an RF signal received by the antenna 1 is amplified by a power amplifier PA within a receiving unit 2, i is multiplied with a locally oscillated cyclic wave to be converted into an IF band signal. After the power level is adjusted by an AGC amplifier, the signal is converted into a baseband signal. The baseband signal is then orthogonally-synchronously-detected. The signals transmitted over carriers whose phases are 0° and 90° are regenerated into I and Q signals for respective carriers by being orthogonally-synchronously-detected. Then, a branch for diversity reception is selected by a diversity selecting unit 18, and the I and Q signals are input to a demodulator 4. A searcher 3 determines despreading timing and the code to be used for despreading based on the I and Q signals input to the demodulator 4, and notifies a despreading unit of the determined timing and code. The despreading unit despreads the signals according to the notification from the searcher 3. A RAKE-received signal is then input to the CH-CODEC unit 10.

The CH-CODEC unit 10 combines slots in order to merge the data, which are separated into the slots and transmitted, into one data. The merged data is deinterleaved, viterbi-decoded, CRC-parity-checked, and input to a data separating/merging unit 7. The data separating/merging unit 7 controlled by a CPU 5 via a CPU interface 6 merges the received data, transmits the merged data to a voice codec 9 or an adapter 8. The voice codec 9 or the adapter 8 reproduces the data as voice or image information.

Conversely, image or voice information input to the voice coded 9 or the adapter 8 is transmitted to the data separating/merging unit 7, which processes the information into data for transmission under the control of the CPU 5. The CH-CODEC unit 10 appends a CRC bit to the processed data. The data is convolutional-encoded, interleaved, and separated into slots for transmission. At this time, the cyclic wave output from a local oscillator 14 is converted into the frequency of a particular channel by an auto frequency controlling unit 13. The auto frequency controlling unit 13 is intended to convert the cyclic wave from the local oscillator 14 into the frequency of a channel to which the cyclic wave is to be transmitted based on the frequency information of the channel estimated by a channel estimating unit 12. Furthermore, the intensity of the cyclic wave from the local oscillator 14, which is converted into the frequency to be a carrier, is adjusted by a signal-to-noise ratio measuring unit 11. The cyclic wave is then input to the CH-CODEC unit 10. The data separated into respective slots are spread and QPSK-modulated by a modulator 15. Then, the data is quadrature-modulated and converted into an RF signal by a transmitting unit 16. The RF signal is transmitted from an antenna 17.

Figure 7:
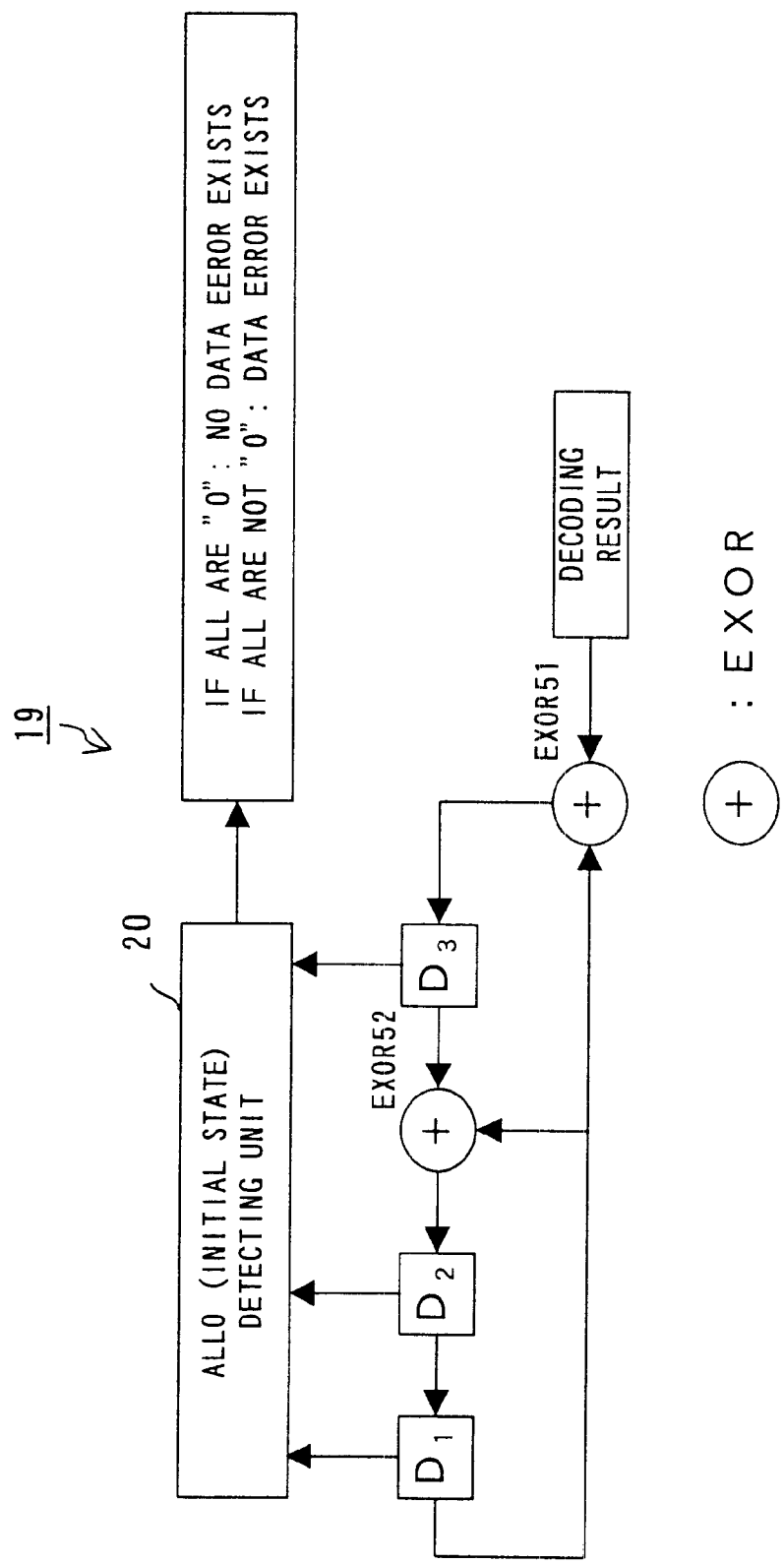
FIG. 7 shows the inverse CRC circuit according to the preferred embodiment of the present invention.

FIG. 7 is a circuit diagram showing the configuration of an inverse CRC circuit according to a preferred embodiment of the present invention.

Figure 3:
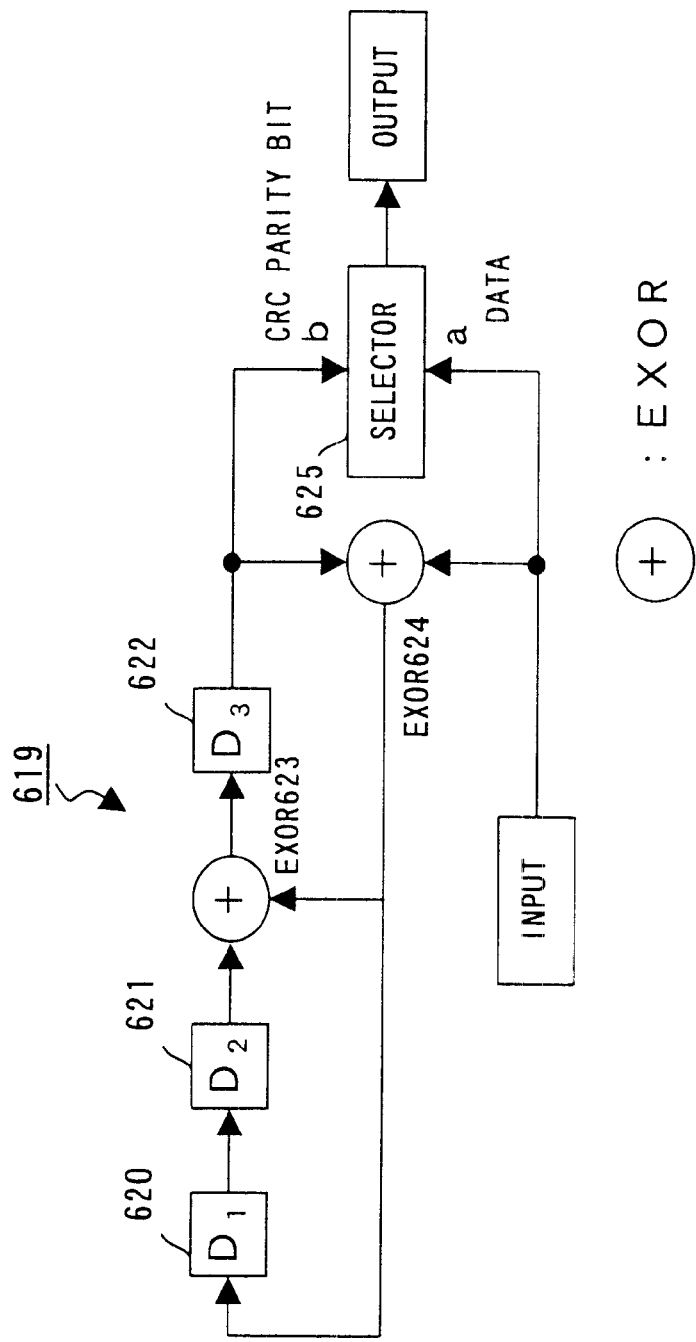
FIG. 3 is a block diagram showing the configuration of a CRC circuit on a transmitting side.
Figure 4:
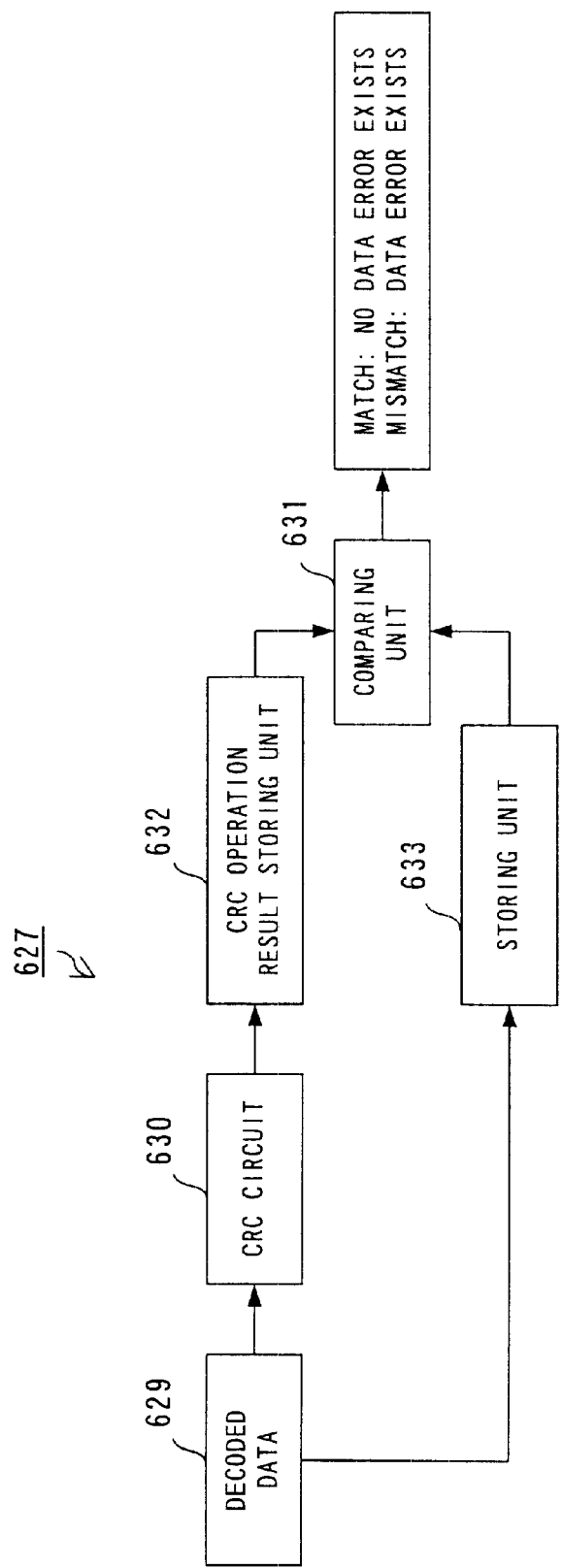
FIG. 4 explains the flow of a CRC parity checking process on a receiving side.
Figure 5:
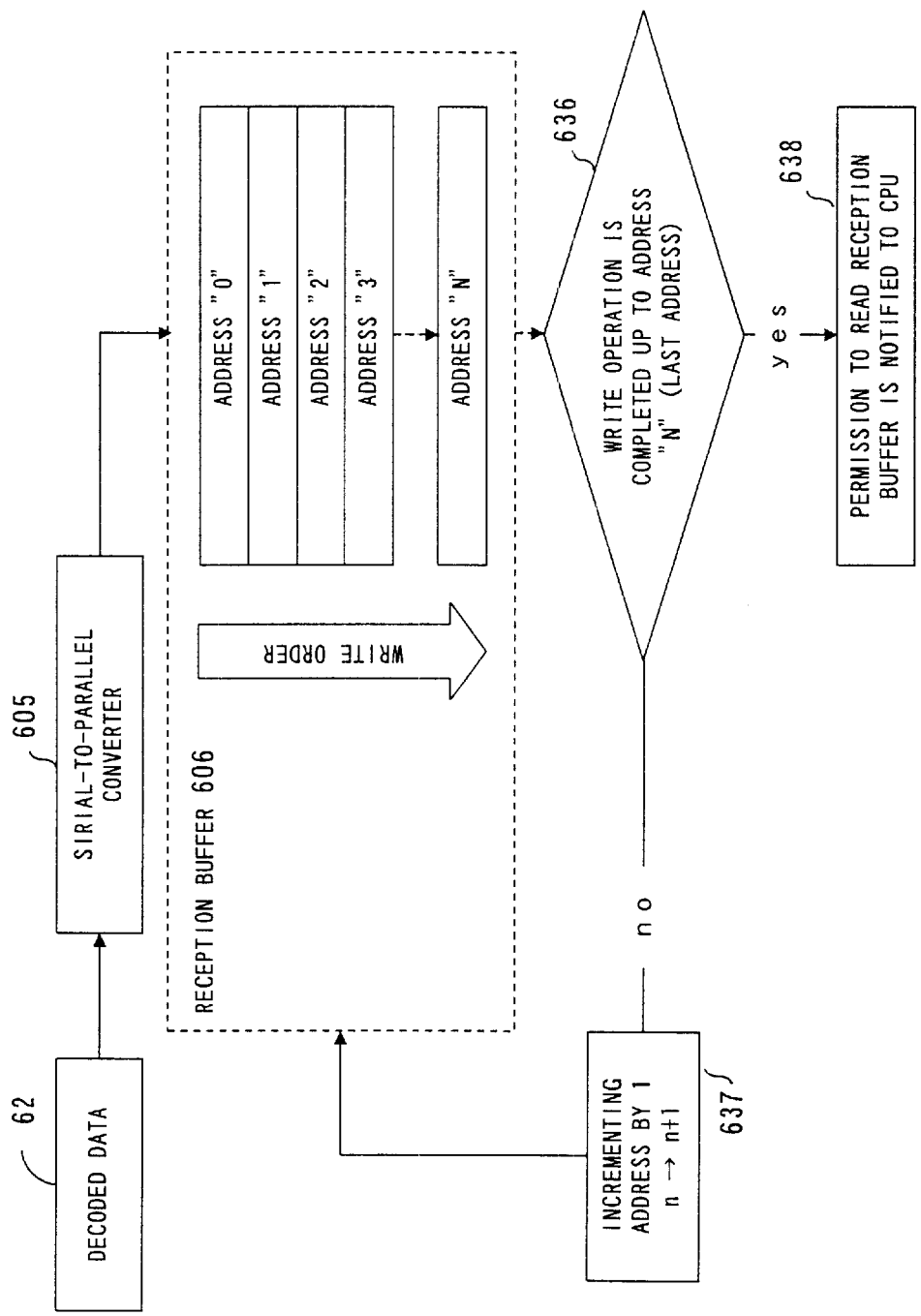
FIG. 5 explains the method for controlling a conventional reception buffer.

An inverse CRC circuit 19 according to this preferred embodiment inversely performs the operation of the CRC circuit shown in FIG. 3.

In this figure, two exclusive-OR operation units 51 and 52 and flip-flops D1' through D3' at three stages, which are connected via the exclusive-OR operation circuit 52, configure what is called a linear feedback shift register.

This linear feedback shift register is composed of the exclusive-OR operation unit 51, to which a decoding result (viterbi decoding result except for a CRC parity bit) and the output of the flip-flops are input, for performing an exclusive-OR operation between these inputs; the flip-flop D3', to which the operation result of the exclusive-OR operation unit 51 is input, for outputting its stored value to the exclusive-OR operation unit 52; the exclusive-OR operation unit 52, to which the output of the flip-flop D1' is input in addition to the output of the flip-flop D3', for performing an exclusive-OR operation between these inputs; the flip-flop D2' for outputting its stored value to the flip-flop D1'; and the flip-flop D1' for outputting its stored value to the exclusive-OR operation unit 51.

As described above, the exclusive-OR operation unit 51, the flip-flop D3', the exclusive-OR operation unit 52, the flip-flop D2', and the flip-flop D1' configure a feedback loop. The exclusive-OR operation unit 51 performs a logical operation represented by an equation (1)" to be described later, whereas the exclusive-OR operation unit 52 performs a logical operation represented by an equation (3)" to be described later. Furthermore, the flip-flops D1' through D3' are DT flip-flops where a clock signal not shown is input to their clock terminals, and are delay elements for delaying input data by one clock and for outputting the delayed data to the next stages. To the flip-flops D1' through D3', the value of the viterbi-decoded CRC parity bit is input as the initial value by a controlling unit not shown.

When all of decoding results are input to the exclusive-OR operation unit 51 and the operation for the decoding result of the Inverse CRC operation circuit 19 is terminated, an ALLO detecting unit 20 reads the stored values of the flip-flops D1' through D3'. The ALLO detecting unit 20 determines that the decoding result is correct (no error exists in the reception data) if all of the stored values are "0", or determines that the decoding result is incorrect (an error exists in the reception data) if all of the values are not "0".

First of all, the operation result (CRC parity bit) obtained by the CRC circuit 619 shown in FIG. 3 is input to the flip-flops D1' through D3' within the inverse CRC circuit 19. For the CRC parity bit, data obtained by viterbi-decoding a reception signal is used. This operation initializes the inverse CRC circuit 19. Then, the bit string of the viterbi-decoded data is input to the exclusive-OR operation unit 51 in an order where the bits are output from the viterbi decoder. When the entire decoded data is input to the exclusive-OR operation unit 51, the ALL0 detecting unit 20 detects whether or not all of the states of the flip-flops D1' through D3' are the initial values ("0") of the flip-flops D1 through D3 within the CRC circuit 619 shown in FIG. 3. No error is determined to exist in the reception data if all of the states are "0", while an error is determined to exist if all of the states are not "0".

Next, the method for generating a CRC parity bit within the inverse CRC circuit 19 is explained by referring to FIG. 8.

FIG. 8 shows the conventional CRC circuit shown in FIG. 3.

Note that the CRC circuit may not be configured as shown in FIG. 8. The CRC circuit may be a linear feedback shift register having a different configuration. The generation method of the inverse CRC circuit according to the preferred embodiment can be flexibly changed according to the configuration of the CRC circuit.

Assume that the states of flip-flops within a CRC circuit 25 at a time "t" is D1=D1(t), D2=D2(t), and D3=D3(t).

Here, the states of the flip-flops D1 through D3 within the CRC circuit 25 at a time "t+1" after input data dt(t) is input are:

$$D1(t+1)=D3(t) \text{ xor } dt(t) \quad (1)$$

$$D2(t+1)=D1(t) \quad (2)$$

$$D3(t+1)=D2(t) \text{ xor } D1(t+1) \quad (3)$$

(xor=exclusive-OR)

On the contrary, to obtain the states of the flip-flops D1 through D3 at the time "t" from the time "t+1", the right sides of the above described equations (1) through (3) are to be represented only by D3(t), D1(t), and D2(t). If the exclusive-OR operation between both of the sides and dt(t) is performed for the equation (1), D1(t+1) xor dt(t)=D3(t) xor dt(t) xor dt(t) - - - (1)' is obtained.

Since an exclusive-OR operation between identical values results in "0" (dt(t) xor dt(t) for the equation (1)'), the equation (1)' is transformed into the following equation (1)".

$$D3(t)=D1(t+1) \text{ xor } dt(t) \quad (1)'$$

Similarly, equations (2)" and (3)" are obtained from the equations (2) and (3).

$$D1(t)=D2(t+1) \quad (2)''$$

$$D2(t)=D3(t+1) \text{ xor } D1(t+1) \quad (3)''$$

The operation circuitry of the logical expressions (1)", (2)", and (3)", which is configured by the flip-flops D1' through D3' and the EXORs 51 and 52, is the inverse CRC circuit 19 shown in FIG. 7.

Also for a CRC circuit having a different configuration, as described above, the state transition of the CRC circuit on a transmitting side is described, logical expressions which retroactively trace the state transition of the CRC circuit in a time-like manner, and an inverse CRC circuit is configured based on the logical expressions, so that the inverse CRC circuit corresponding to the CRC circuit having an arbitrary configuration on the transmitting side can be configured. Furthermore, not for a CRC code, but for a code if it is generated by the logical operations between the respective bits of data to be transmitted on a transmitting side, and if it can be examined whether or not the code is correctly received, an error in a reception code can be examined by generating an inverse code generating circuit with the application of the above described method.

Specific examples of the operations of the CRC circuit 25 and the inverse CRC circuit 19 are provided below. Here, assume that 5-bit data composed of "1", "1", "1", "0", and "0" is serially input as data dt(t) in FIG. 8. After all of the flip-flops D1 through D3 within the CRC circuit 25 are initialized (initiated to "0"), the exclusive-OR operation between the state of the flip-flop D3 "0" and input data "1"is performed and "1"is obtained in the EXOR 21 within the CRC circuit 25, if the beginning of the data "1"is input. As a result, the values of the EXOR21, the D1, and the EXOR 22 are respectively input to the flip-flops D1 through D3 in the next time slot. Therefore, D1=0, D2=0, and D3=1 are obtained. Similar operations are repeated for the subsequent input data bits, so that the CRC operation is performed. The state transitions of the flip-flops D1 through D3 and the EXORs 21 and 22 within the CRC circuit 25 for each of the input data bits are shown in Table 1.

TABLE 1

| CRC Circuit Transition | | | | | |
|---|---|---|---|---|---|
| | D1 | D2 | D3 | EXOR21 | EXOR22 |
| Input Data | 0 | 0 | 0 | | |
| 1 | 1 | 0 | 1 | 1 | 1 |
| 1 | 0 | 1 | 0 | 0 | 0 |
| 1 | 1 | 0 | 0 | 1 | 0 |
| 0 | 0 | 1 | 0 | 0 | 0 |
| 0 | 0 | 0 | 1 | 0 | 1 |

As shown in Table 1, the result of the CRC operation of the CRC circuit 25 becomes the states of the flip-flops D1 through D3 (D1, D2, D3)=(0, 0, 1) when the data is input to the CRC circuit 25 to its end.

In the inverse CRC circuit 19, this CRC operation result (D1, D2, D3)=(0, 0, 1) is input to the flip-flops D1' through D3'. Then, the data is input sequentially from its end to start "0", "0", "1", "1" and "1". The state transitions of the flip-flops D1' through D3' and the EXORs 51 and 52 within the inverse CRC circuit 19 for each of the input data bits are shown in Table 2.

TABLE 2

| Inverse CRC Circuit Transition | | | | | |
|---|---|---|---|---|---|
| | D1 | D2 | D3 | EXOR51 | EXOR52 |
| Input Data | 0 | 0 | 1 | | |
| 0 | 0 | 1 | 0 | 1 | 0 |
| 0 | 1 | 0 | 0 | 0 | 0 |
| 1 | 0 | 1 | 0 | 1 | 0 |
| 1 | 1 | 0 | 1 | 0 | 1 |
| 1 | 0 | 0 | 0 | 0 | 0 |

As shown in Table 2, all of the states of the flip-flops D1' through D3' within the inverse CRC circuit 19 are "0", that is, the states are equal to the initial values of the flip-flops D1 through D3 within the CRC circuit 25 when the reception data is input to its end. Therefore, it is proved that CRC parity checking can be made by inputting the reception data to the inverse CRC circuit 19 from its end to start.

Figure 1:
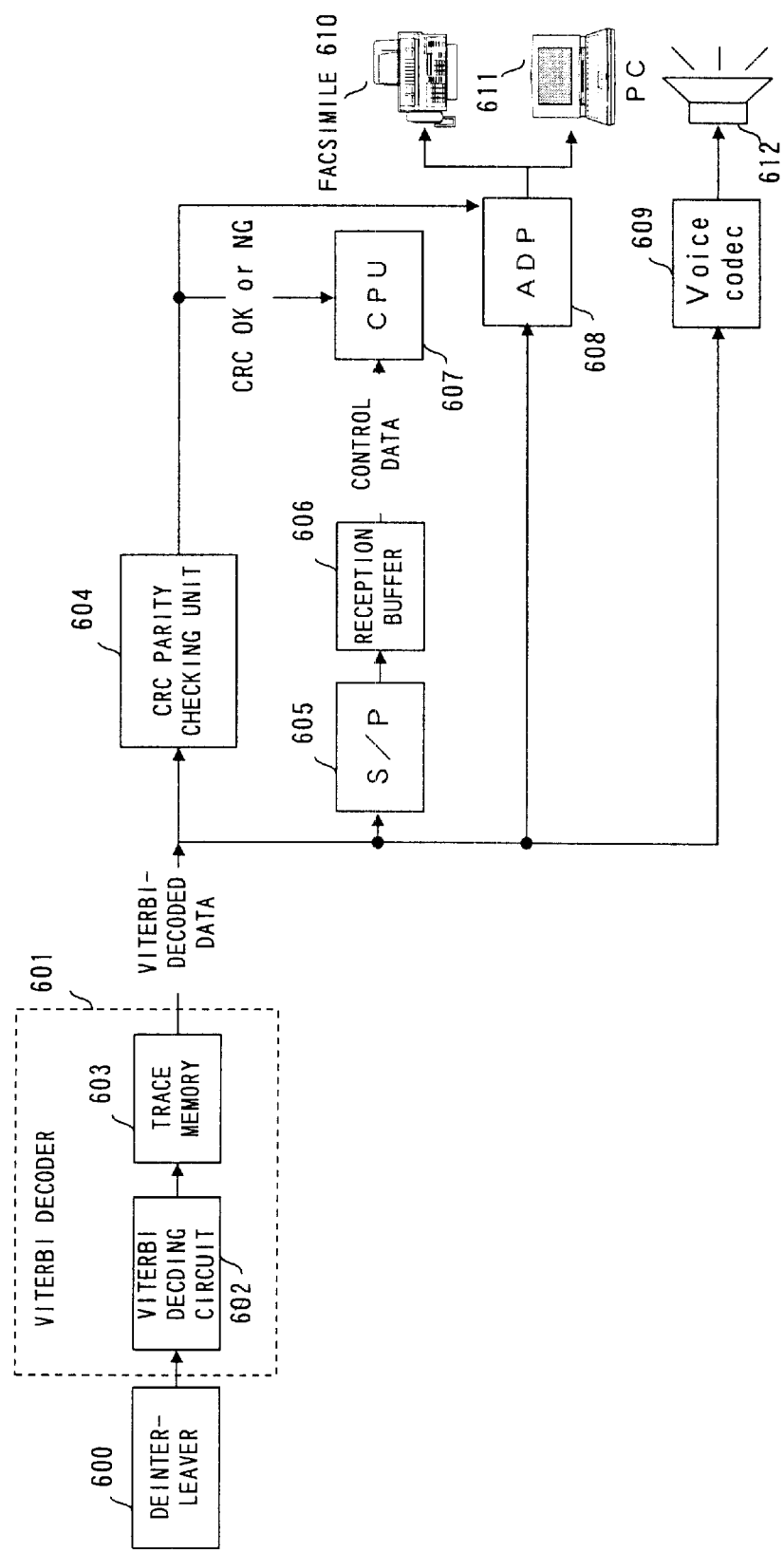
FIG. 1 is a block diagram showing the outline of the configuration of a conventional receiving device for performing viterbi decoding and CRC parity checking.
Figure 2:
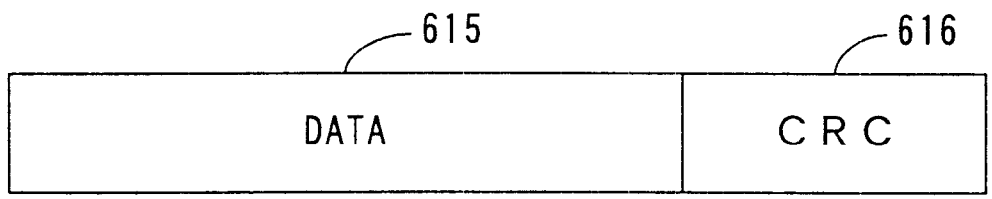
FIG. 2 shows the format of normal transmission data.

If data which is convolutional-encoded and transmitted is viterbi-decoded after a CRC parity bit is appended to the end of the data as shown in FIG. 2, the CRC parity bit is first decoded and the data is decoded sequentially from its end to start. Therefore, CRC parity checking can be made by inputting viterbi-decoded data in a decoding order with the inverse CRC circuit 19, which eliminates the need for the trace memory 603 shown in FIG. 1.

Figure 9:
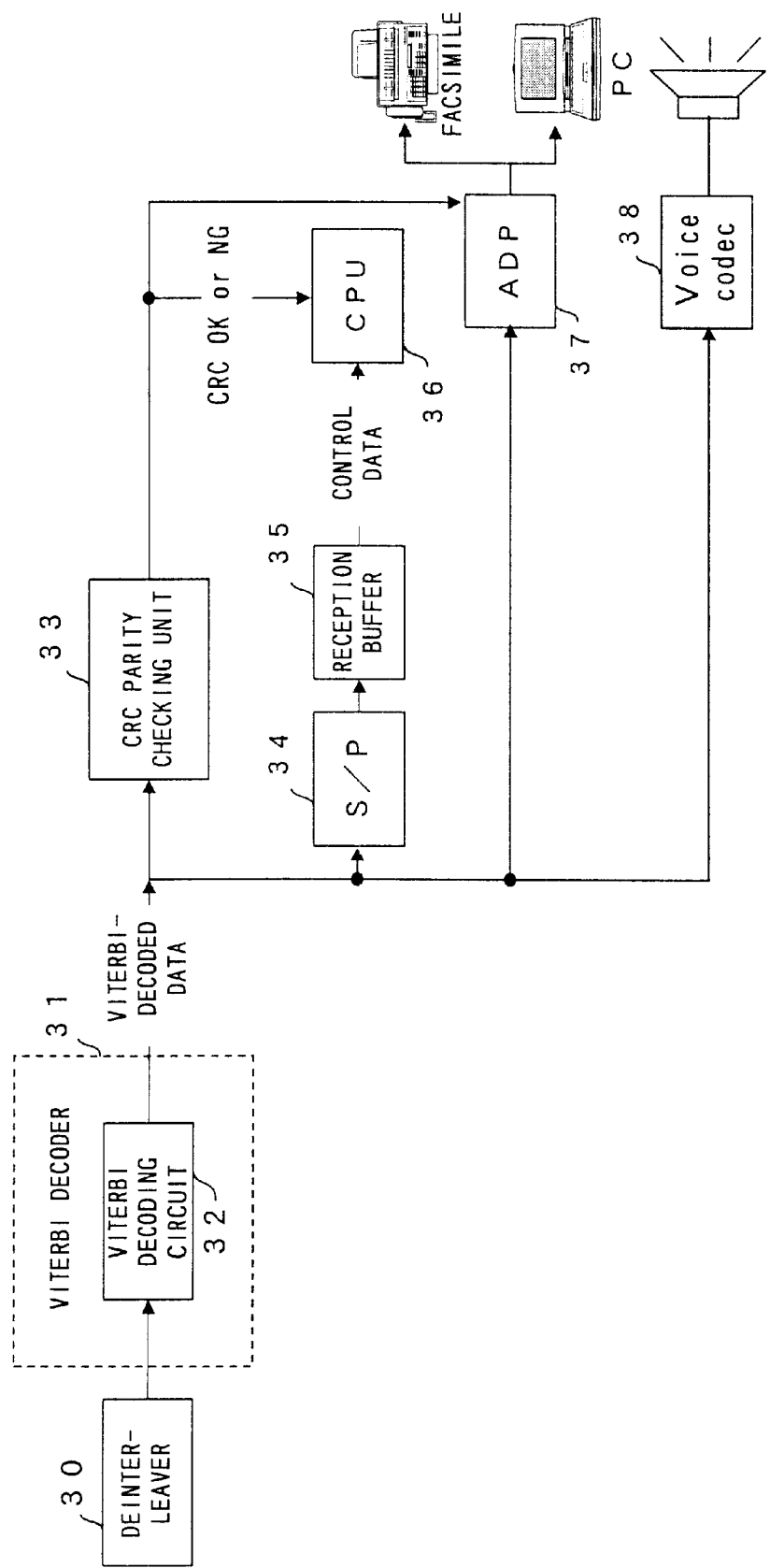
FIG. 9 shows the partial configuration of a receiving circuit to which the inverse CRC circuit according to the preferred embodiment of the present invention is applied.

FIG. 9 is a block diagram showing the configuration of the principal part, which relates to the present invention, of a receiving circuit using the inverse CRC circuit 19 according to this preferred embodiment.

A data signal deinterleaved by a deinterleaver 30 is input to a viterbi decoder 31. The viterbi decoder 31 comprises a viterbi decoding circuit 32, and viterbi-decodes the deinterleaved data signal by using the viterbi decoding circuit 32. The data signal obtained by performing viterbi decoding is output from its end to start. Since the viterbi decoder 31 is installed with the inverse CRC circuit according to this preferred embodiment, trace memory is not arranged unlike the conventional viterbi decoder 601.

The data viterbi-decoded by the viterbi decoder 31 is input to a CRC parity checking unit 33. The CRC parity checking unit 33 is implemented by the above described inverse CRC circuit 19, and makes parity checking for reception data by sequentially inputting viterbi-decoded data. The CRC parity checking unit 33 outputs the result of the parity checking to a CPU 36 and an adapter 37.

Additionally, the data viterbi-decoded by the viterbi decoder 31 is input to a serial-to-parallel converter 34. The serial-to-parallel converter 34 converts the input viterbi-decoded data from serial to parallel, and inputs the parallel data obtained by performing the conversion to a reception buffer 35. When data of one packet is input to the reception buffer 35, the CPU 36 accesses the reception buffer 35, and reads control data from its start to end out of the reception buffer 35. Accordingly, the reception buffer 35 assumes the responsibility of the process which was conventionally performed by a trace memory.

The data viterbi-decoded by the viterbi decoder 31 is input also to the adapter 37 and a voice codec 38. In this case, the reception data is input to the adapter 37 and the voice codec from its end to start. Because both of the adapter 37 and the voice codec 38 temporarily store input data in internal memories for their processes before processing the input data into image or voice information and outputting the information, accesses are made to the internal memories so that the reception data is read from its start to end, similar to the above described reception buffer 35. As a result, the decoded data which is output and received from the viterbi decoder 31 can be read out in a correct order.

The result of the CRC parity checking unit 33 is input to the CPU 36 or the adapter 37. However, if a data error is determined to exist at this time, the CPU 36 or the adapter 37 performs a process such as a process for requesting a transmitting side to retransmit the data, etc.

Figure 10:
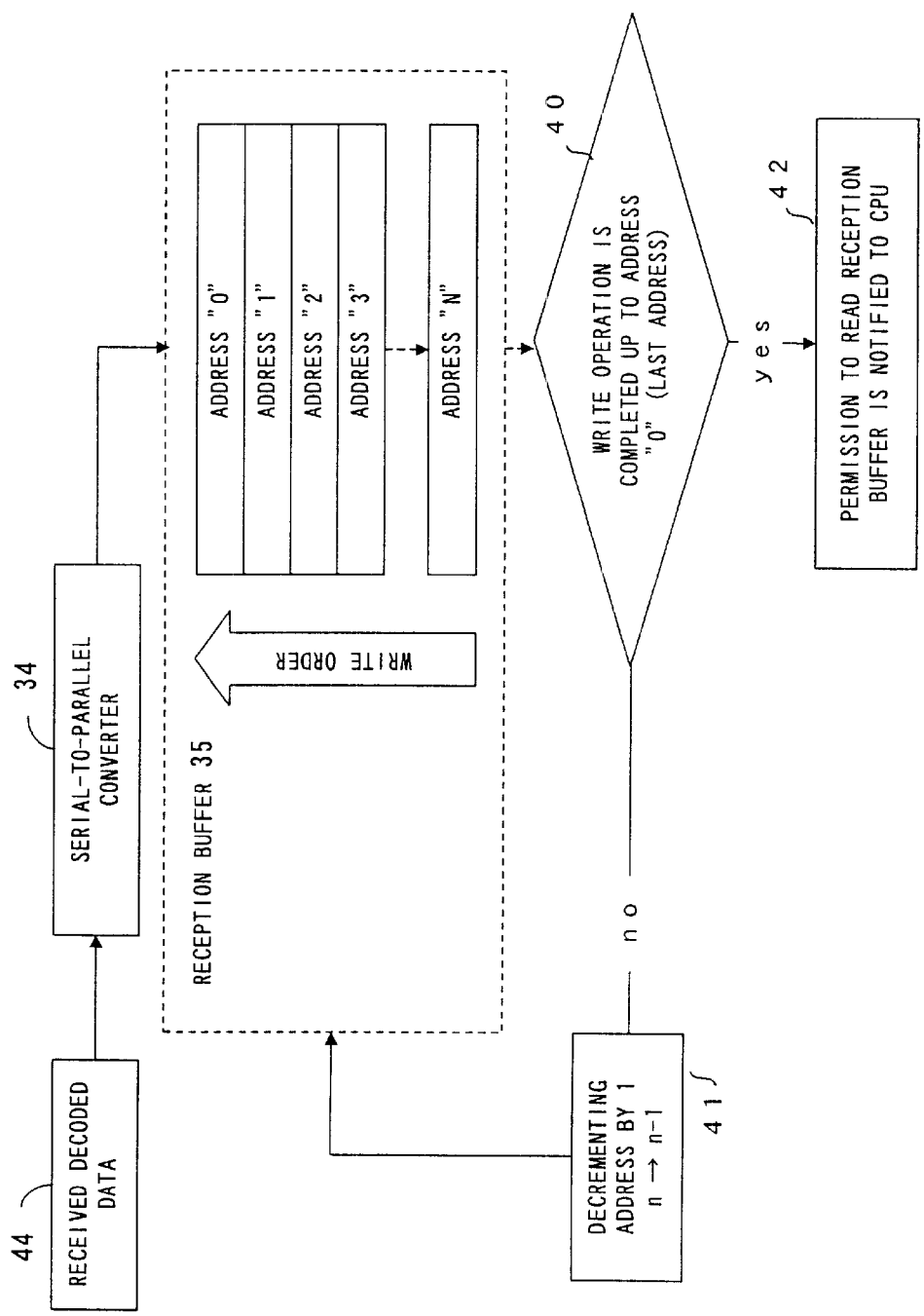
FIG. 10 explains the operations of a reception buffer according to the preferred embodiment.

FIG. 10 explains the accesses made to the reception buffer 35 according to this preferred embodiment.

Since reception data is output from its end to start out of the viterbi decoder 31, the CPU 36 must read the control data stored in the reception buffer 35 from its start to end in order to properly process the control data. Such a data read operation is performed not only for the reception buffer 35 but also for the internal memories of such as the adapter 37 connected to an image outputting device, the voice codec 38 connected to a voice outputting device, and the like. The operation enabling such a read operation for received decoded data is explained by taking the case of the reception buffer 35 as an example.

With the operation of the reception buffer 35 according to this preferred embodiment, which is performed simultaneously with the CRC parity checking, received decoded data 44 output from the viterbi decoder 31 is converted from serial to parallel in a decoding order, that is, the data sent from a transmitting side is converted from its end to start. The address to which the parallel data obtained by performing the conversion is written is decremented by 1 from an address "N" to an address "0". When the parallel data is written up to the address "0", permission to read the reception buffer 35 is notified to the CPU 36 by using a flag, etc.

As described above, even if data transmitted to the reception buffer 35 is written from its end in a descending order starting from an address "N", the contents of the data stored in the reception buffer upon completion of the write operation and the time taken to write the data to the reception buffer 35 are the same as those in the case where the data is written to the conventional reception buffer 606.

For control data, reception data is once memory-expanded in the reception buffer 35, and is then passed to the CPU 36. Also voice or image data is once expanded in the internal memory of the adapter 37 or the voice codec 38.

After the received decoded data 44 is converted from serial to parallel by the serial-to-parallel converter 34, it is input to the reception buffer 35. The capacity of the reception buffer 35 is secured by the number of pieces of 1-packet data, and the parallel data is written in a descending order of addresses from the last address of the reception buffer 35. Then, it is determined whether or not the write operation is terminated up to the address "0" (40). If the write operation is not terminated up to the address "0", the address is decremented by 1 (41), and the next parallel data is read into the address obtained by the decrement operation. If the write operation of the parallel data is determined to be terminated up to the address "0"(40), the read operation for the data of 1 packet is proved to be terminated. Therefore, permission to read the reception buffer 35 is notified to the CPU 36. With the above described write operation of the parallel data, the data input from its end to start is stored in the reception buffer 35 in the descending order from the higher address to the lowest address "0", so that the data transmitted from a transmitting side can be read from its start to end by reading the parallel data stored in the reception buffer 35 sequentially from the first address of the reception buffer 35. Consequently, control data can be properly processed.

The above described preferred embodiment is explained by taking parity checking using a CRC code as an example. However, the present invention is not limited to the CRC code. The present invention may be similarly applied also to a circuit making parity checking for data after being viterbi-decoded by using a suitable code except for the CRC code.

Additionally, decoded data which can be error-detected by the present invention is not limited to data obtained by performing viterbi decoding. The decoded data may be data obtained by performing a different decoding method for decoding a code in an inverse order of encoding.

According to the present invention, a processing delay of error detection in a decoding result can be significantly shortened in the processing of a decoding unit which comprises a viterbi decoder, etc., which is effective for a high-speed process of control data, etc. Furthermore, the size and the consumption power of an LSI onto which the device according to the present invention is mounted can be reduced, and a processing delay caused by writing and reading decoded data to a trace memory can be shortened, whereby the error detection processing promises to become faster.

What is claimed is:

1. An error detecting device, to which a decoding result of a code obtained by encoding a message composed of data and a parity bit of the data, which is appended to an end of the data, for detecting an error in the decoding result, comprising:

an operating unit, to which a bit string of the decoding result is input in a decoding order, performing an operation process for generating a parity bit for all of bits except for the decoded value of the parity bit within the bit string by recognizing as an initial value the decoded value of the parity bit within the bit string, and performing an inverse operation process; and a determining unit determining whether or not the decoding result is an error by detecting whether or not a final operation result of said operating unit matches an initial state of the operation process for generating the parity bit.

2. The error detecting device according to claim 1, wherein said operating unit is a linear feedback shift register composed of flip-flops at "m" stages and "n" exclusive-OR operation units.

3. The error detecting device according to claim 1, wherein the parity bit is a CRC parity bit.

4. The error detecting device according to claim 1, wherein the code is a convolutional code.

5. The error detecting device according to claim 4, wherein the decoding result is obtained by performing de coding implemented by a maximum likelihood decoding method.

6. The error detecting device according to claim 5, wherein the maximum likelihood decoding method is a viterbi decoding method.

7. The error detecting device according to claim 1, wherein the code is received via a communications channel.

8. An error detecting method for detecting an error in a decoding result of a code by inputting the decoding result of a code obtained by encoding a message composed of data and a parity bit of the data, which is appended to an end of the data, comprising:

(a) inputting a bit string of the decoding result in a decoding order;

(b) performing an operation process for generating the parity bit for all of bits except for a decoded value of the parity bit within the bit string by recognizing as an initial value the decoded value of the parity bit within the bit string, and performing an inverse operation process; and (c) determining whether or not the decoding result is an error by detecting whether or not a final operation result obtained by the operation in the step (b) matches an initial state of the operation process for generating the parity bit.

9. The error detecting method according to claim 8, wherein the parity bit is a CRC parity bit.

10. The error detecting method according to claim 8, wherein the code is a convolutional code.

11. The error detecting method according to claim 10, wherein the decoding result is obtained by performing decoding implemented by a maximum likelihood decoding method.

12. The error detecting method according to claim 11, wherein the maximum likelihood decoding method is a viterbi decoding method.

13. The error detecting method according to claim 8, wherein the code is received via a communications channel.

* * * * *